(12) United States Patent
Huettner et al.

(10) Patent No.: US 8,984,897 B2
(45) Date of Patent: Mar. 24, 2015

(54) ENDOTHERMIC REACTION APPARATUS FOR REMOVING EXCESS HEAT IN A DATACENTER

(75) Inventors: Cary M. Huettner, Rochester, MN (US); Joseph Kuczynski, Rochester, MN (US); Robert E. Meyer, III, Rochester, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1006 days.

(21) Appl. No.: 12/560,497

(22) Filed: Sep. 16, 2009

(65) Prior Publication Data

US 2011/0063796 A1    Mar. 17, 2011

(51) Int. Cl.
*F25D 5/00*       (2006.01)
*H05K 7/20*       (2006.01)

(52) U.S. Cl.
CPC .................................. *H05K 7/20827* (2013.01)
USPC ............................................... 62/4; 62/259.2

(58) Field of Classification Search
USPC .................................................... 62/4, 259.2
See application file for complete search history.

(56) References Cited

U.S. PATENT DOCUMENTS

| | | | |
|---|---|---|---|
| 3,468,796 A * | 9/1969 | Noll et al. ..................... 210/641 |
| 4,010,620 A * | 3/1977 | Telkes ................................. 62/4 |
| 4,283,211 A | 8/1981 | Ehrlich et al. | |
| 4,291,755 A * | 9/1981 | Minto ...................... 165/104.12 |
| 4,936,114 A | 6/1990 | Engdahl et al. | |
| 5,038,574 A * | 8/1991 | Osborne ......................... 62/101 |
| 5,575,835 A * | 11/1996 | Bailey et al. ........................ 96/7 |
| 6,237,346 B1 * | 5/2001 | Ogoshi et al. ..................... 62/4 |
| 6,341,491 B1 * | 1/2002 | Paine et al. ......................... 62/4 |
| 6,360,559 B1 | 3/2002 | Midorikawa | |
| 6,557,624 B1 * | 5/2003 | Stahl et al. ...................... 165/53 |
| 7,010,392 B2 | 3/2006 | Bash et al. | |
| 7,165,412 B1 | 1/2007 | Bean | |
| 7,219,512 B1 | 5/2007 | Wilding et al. | |
| 7,426,453 B2 | 9/2008 | Patel et al. | |
| 7,955,568 B2 | 6/2011 | Ullman et al. | |
| 2004/0008483 A1 | 1/2004 | Cheon | |
| 2005/0023363 A1 | 2/2005 | Sharma et al. | |
| 2005/0235671 A1 | 10/2005 | Belady et al. | |
| 2006/0171117 A1 | 8/2006 | Hamman | |
| 2006/0256526 A1 * | 11/2006 | Hamman ...................... 361/699 |
| 2007/0163748 A1 | 7/2007 | Rasmussen et al. | |
| 2008/0108296 A1 | 5/2008 | Rimmer et al. | |
| 2008/0135217 A1 * | 6/2008 | Turovskiy et al. ........ 165/104.33 |
| 2008/0140259 A1 | 6/2008 | Bash et al. | |
| 2008/0141703 A1 * | 6/2008 | Bean, Jr. ......................... 62/434 |
| 2008/0198549 A1 | 8/2008 | Rasmussen et al. | |
| 2008/0205003 A1 * | 8/2008 | Belady .......................... 361/700 |

\* cited by examiner

*Primary Examiner* — Cheryl J Tyler
*Assistant Examiner* — David Teitelbaum
(74) *Attorney, Agent, or Firm* — Roy W. Truelson (57) ABSTRACT

Embodiments of the present invention generally provide for a system that removes excess thermal energy from a datacenter. In one embodiment, the system includes a holding container with highly thermally conductive surfaces installed in the warmest area(s) of the datacenter. Two substances are released into the holding container and are mixed creating a liquid solution and causing an endothermic reaction. The resulting reaction transfers thermal energy from the datacenter air to the new solution. The liquid solution is then pumped out of the datacenter, where it can be passed through a dialyzing membrane or an evaporation chamber, which separates the liquid solution into its two original substances.

2 Claims, 8 Drawing Sheets

FIG. 7B

ENDOTHERMIC REACTION APPARATUS FOR REMOVING EXCESS HEAT IN A DATACENTER

BACKGROUND

1. Field of the Invention

The field of invention relates to datacenter cooling. In particular, the field of invention relates to removing excess heat from a datacenter.

2. Description of the Related Art

During the normal operation of a datacenter, a significant amount of thermal energy is dissipated into the operating environment, often resulting in an increase of temperature and in increased demands on the cooling infrastructure. This in turn results in increased utility costs. At present, there are no known solutions to this problem other than to increase the cooling capacity of the on-site computer room air conditioning (CRAC) units.

SUMMARY OF THE DISCLOSURE

In general, embodiments of the invention described herein leverage the endothermic properties of mixing chemical substances (hereinafter "substance") to absorb datacenter thermal energy. The thermal energy can then be transported away from the datacenter and dissipated elsewhere.

One embodiment of the invention includes a datacenter system comprising a cooling solution further comprising a first substance and a second substance, wherein the combination of the first substance and the second substance create an endothermic reaction; a holding container configured to circulate the cooling solution; and a separation unit coupled to the holding container configured to separate the cooling solution into the first substance and the second substance.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Embodiments of the present invention generally provide for a system that removes excess thermal energy from a datacenter. In one embodiment, the system includes a holding container with a highly thermally conductive surface installed in the warmest area(s) of the datacenter. Two substances are released into the holding container and are mixed causing an endothermic reaction (hereinafter "cooling solution"). The resulting reaction transfers thermal energy from the datacenter air to the cooling solution. The cooling solution is then pumped out of the datacenter, where it can be passed through a dialyzing membrane or an evaporation chamber, which separates the cooling solution into its two original substances (either both liquids or a salt slurry and water). The process can then begin anew, continuously drawing waste heat from the datacenter and reducing the overall cooling demands on the CRAC infrastructure.

In addition, an alternative embodiment of the present invention may include a system configured to perform as a backup to rooftop CRAC systems. Current rooftop CRAC systems, like glycol cooled systems for example, have an inherent problem on warm days and in hot climates. The pump package and the fluid cooler in the rooftop CRAC systems become so hot that the systems overheat and the CRAC systems shut down. An embodiment of the present invention reduces the dependence on this flawed system by cooling a datacenter after a rooftop CRAC unit failure.

Figure 1:
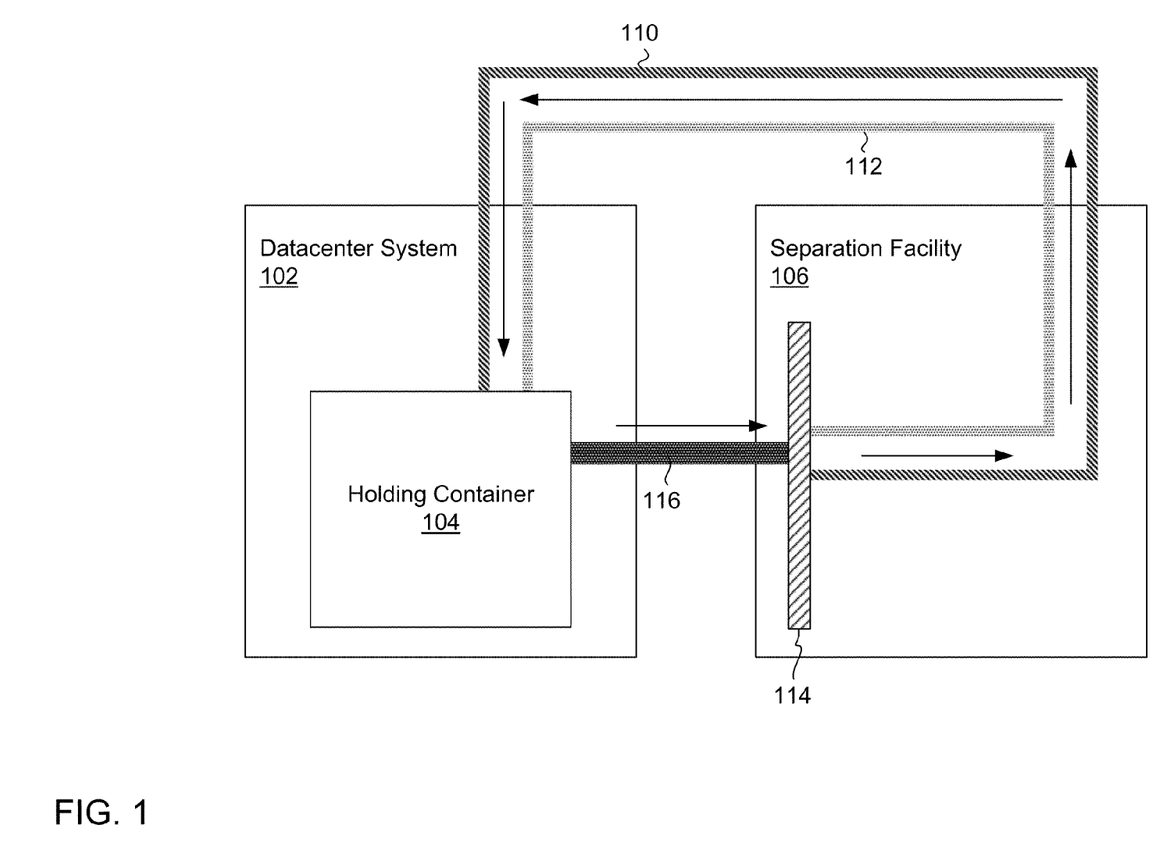
FIG. 1 is a block diagram of a datacenter system that removes excess thermal energy from a datacenter, according to one embodiment of the invention.

FIG. 1 is a block diagram of an embodiment of a system that removes excess thermal energy from a datacenter. A datacenter system 102 includes a holding container 104, wherein the holding container 104 functions as a cooling unit and is configured to circulate a cooling solution 116 and wherein the holding container 104 is designed to maximize surface area. Further, the holding container 104 is composed of a highly thermally conductive material, such as copper or aluminum for example. Those skilled in the art will appreciate that the datacenter system 102 may include more than one holding container 104 to expedite thermal energy transfer and reduce demand on the CRAC cooling infrastructure.

The holding container 104 is connected to a first substance transport carrying a first substance 110 and a second substance transport carrying a second substance 112 that when mixed cause an endothermic reaction and create the cooling solution 116 circulated by the holding container 104. Examples of such mixtures include water and ammonium nitrate; water and potassium chloride; water and methanol; and water and calcium chloride. Additional solutions are detailed in Table 1.

TABLE 1

Solution Heat Removal Capacity

| Compound | Heat of Solution (kcal/mole) |
| --- | --- |
| $NH_4Cl$ | 3.533 |
| $NH_4ClO_4$ | 8.000 |
| $N(CH_3)_4I$ | 10.055 |
| $KNO_3$ | 8.340 |
| $KClO_4$ | 12.200 |
| $CsClO_4$ | 13.250 |
| $RbClO_4$ | 13.560 |

As shown in Table 1, the above compounds which represent various mixed cooling solutions have an associated "Heat of Solution", wherein the greater the heat of solution, the greater the heat removal capacity of the cooling solution.

The datacenter system 102 is configured to release the first substance 110 and the second substance 112 into the holding container 104 where it is mixed to create the cooling solution 116. The endothermic reaction initiated by the combination of substances draws thermal energy out of the warm air in the datacenter, cooling the air and transferring the thermal energy to the cooling solution.

The holding container 104 is also coupled to a separation facility 106, wherein the separation facility 106 includes a separation unit 114. The thermal energy stored in the cooling solution 116 is dissipated as the cooling solution 116 is passed through the separation unit 114, wherein the separation unit 114 may be a dialyzing membrane useful for separating mixtures such as water/methanol, for example. In particular, the membrane may be a hydrophilic, semi-permeable polyamide, for example. Further, the membrane may be composed, for example, of polymer compounds and dimethyl sulfoxide useful for separating chemicals from their mixtures, as is known in the art.

Alternatively, the separation unit 114 may be an evaporation chamber for water/salt slurry mixtures for example. The membrane or chamber effectively separates the cooling solution 116 into the first substance 110 and the second substance 112.

In an alternative embodiment, the separation facility 106 is designed to test the purity of the separated substances and is designed to alert an operator that the separation unit 114 must be replaced if purity is below a predefined threshold. In yet another embodiment, if the purity is below a predefined threshold and the separation unit 114 is a dialyzing membrane with improved performance characteristics after exposure to high heat, the separation facility 106 is designed to treat the separation unit 114 under high heat.

The separation facility 106 is coupled to the datacenter and pumps the first substance 110 and the second substance 112 separately back to the datacenter system 102 and into the holding container 104 to repeat the process.

Figure 2A:
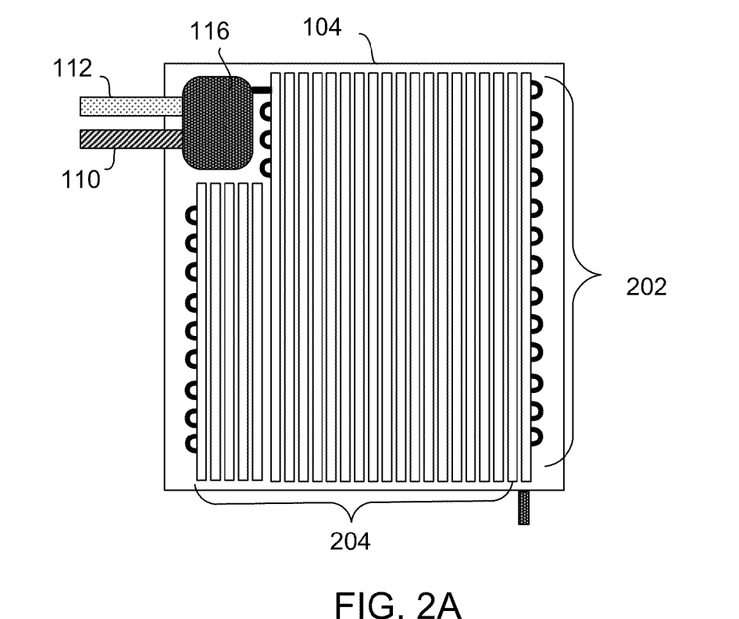
FIGS. 2A-2C provide detailed illustrations of the holding container of FIG. 1, according to one embodiment of the invention.
Figure 2B:
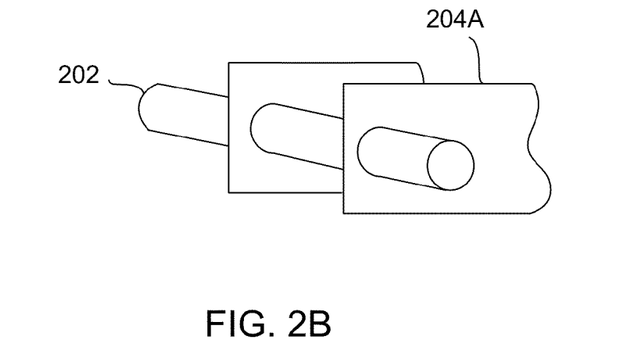
Figure 2C:
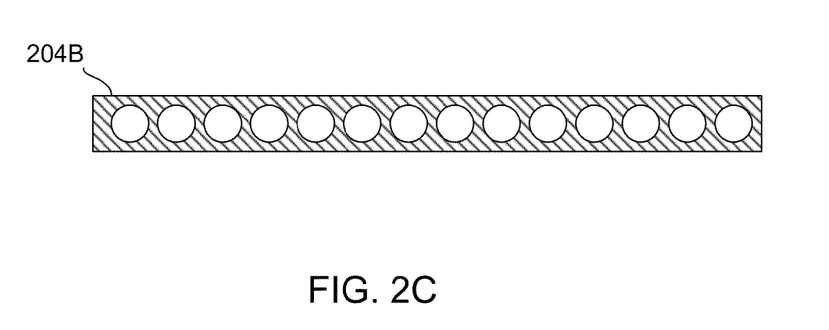

FIGS. 2A-2C provide detailed illustrations of the holding container 104 of FIG. 1, according to one embodiment of the invention.

FIG. 2A shows a detailed view of the holding container 104, wherein the cooling solution 116 is circulated via a coiled pipe 202 affixed to an array of thin planar members 204 so as to increase the surface area of the holding container 104 as described in further detail in FIG. 2B.

In FIG. 2A, the first substance 110 and the second substance 112 mix in the holding container 104 to cause an endothermic reaction, creating the cooling solution 116. The cooling solution 116 is circulated via a coiled pipe 202 and stores the thermal energy transferred from the air in the datacenter to the cooling solution 116. In an alternative embodiment, the interior of the coiled pipe includes turbulence generating elements designed to enhance turbulence through the coiled pipes 202 and improve the thermal energy transfer from the datacenter air to the cooling solution 116.

FIG. 2B shows a cross section of the coiled pipe 202 and a segment of the array of thin planar members 204A, wherein each thin planar member in the array of thin planar members 204A adjoins with the coiled pipe 202 along the thinnest edge of the planar member and wherein each planar member is adjacently spaced along the length of the coiled pipe so as to create adjacent air passages.

FIG. 2C shows an alternative view of an individual thin planar member 204B, wherein the individual thin planar member 204B includes adjacently separated recesses designed to connect to the length of the coiled pipe. A plurality of the thin planar members 204B creates the array of thin planar members of FIG. 2B.

Figure 3A:
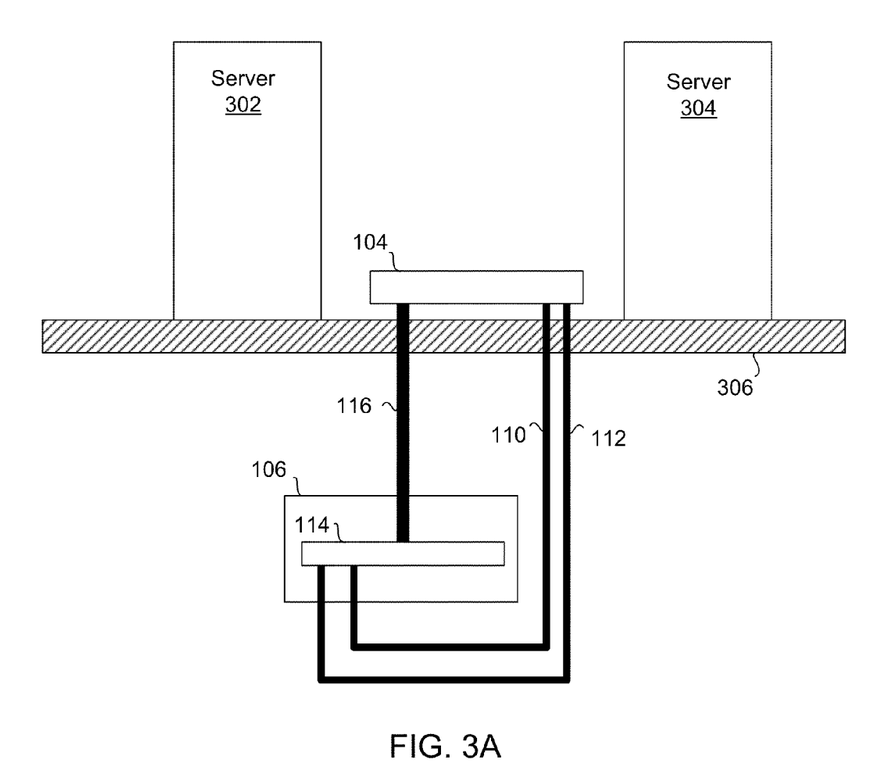
FIG. 3A is a cross section view of a datacenter system, wherein the separation facility is below the datacenter, according to one embodiment of the invention.

FIG. 3A is a vertical cross section view of a datacenter system, wherein the separation facility is below the datacenter, according to one embodiment of the invention. As shown, the holding container 104 may be positioned between server 302 and server 304. In an alternative embodiment, the holding container 104 may be positioned in an area of the datacenter prone to overheating. Further, the holding container 104 may pump the cooling solution 116 and may receive the first substance 110 and the second substance 112 through a datacenter floor panel 306. Similar to FIG. 1, the separation unit 114 in the separation facility 106 in FIG. 3 is designed to separate the first substance 110 and the second substance 112.

Figure 3B:
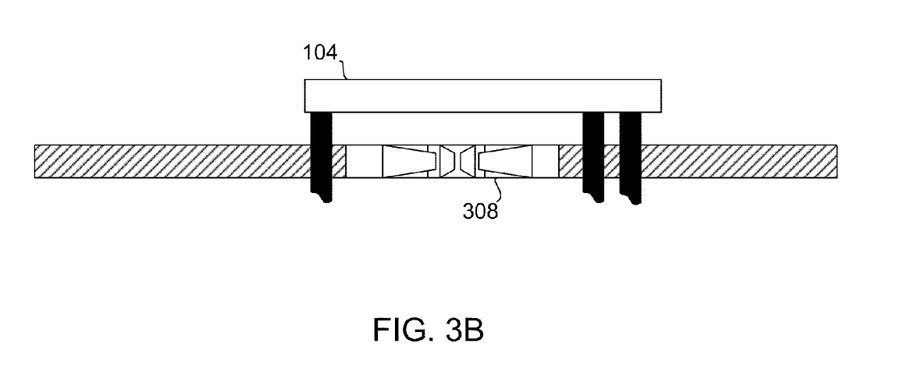
FIG. 3B is a close-up cross section view of an alternative embodiment of the datacenter system of FIG. 3A.

FIG. 3B is a close-up cross section view of an alternative embodiment of the datacenter system of FIG. 3A. As shown, the floor below the holding container may be adapted to include a fan 308 that forces air through the array of thin planar members in the holding container 104 so as to increase thermal energy transfer. In one embodiment, the fan 308 is connected to a datacenter vent system configured to circulate datacenter air, wherein the fan pulls higher temperature air from the datacenter via the vent system and forces the air through the array of thin planar members.

In an alternative embodiment, the fan 308 blows air directly from the cavity below the floor to the datacenter. The fan is further coupled to a hinged flap member that prevents air transfer between the space under the floor and the datacenter when the blades of the fan 308 are not rotating. The hinged flap member disengages and allows air transfer when the blades of the fan 308 rotate. In an alternative embodiment, the fan may be configured to force air through the array of thin planar members only after the datacenter temperature is above a predefined threshold.

Figure 4:
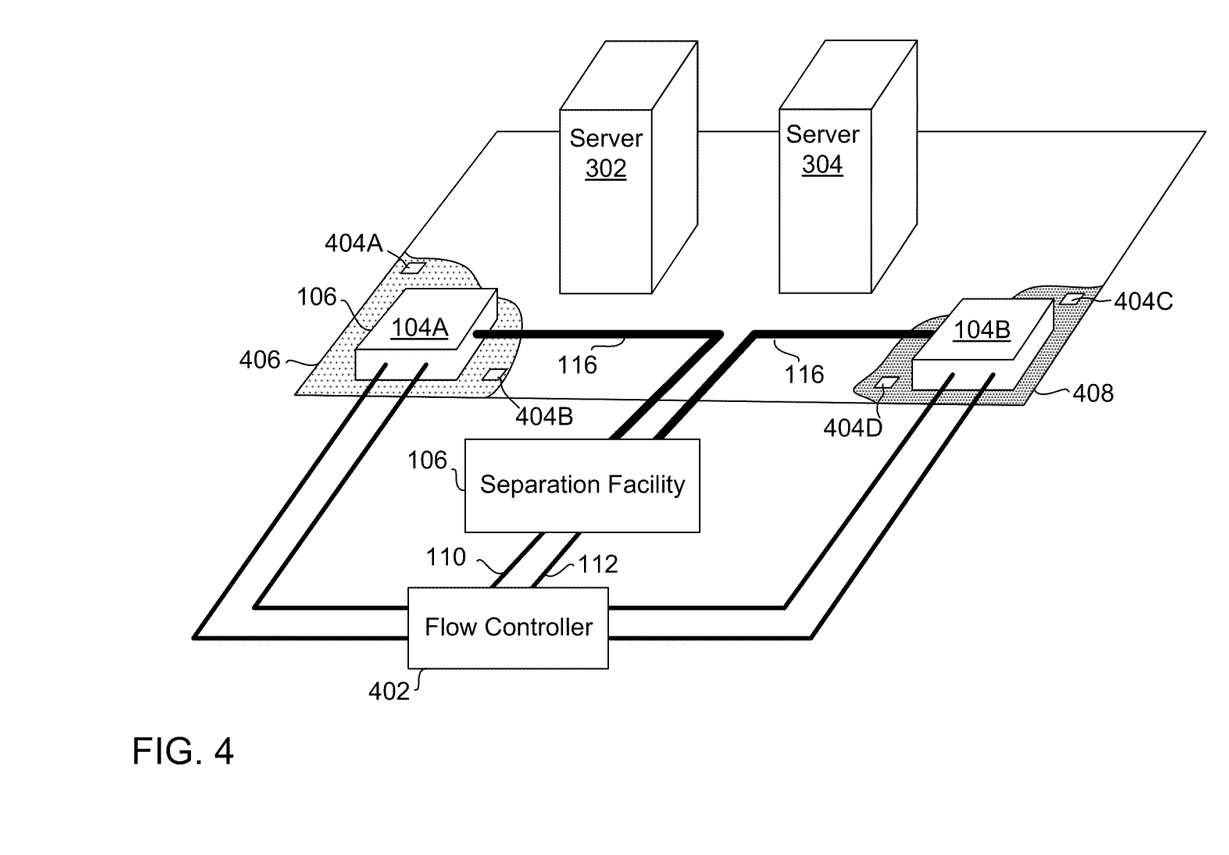
FIG. 4 is an illustration of a datacenter system that includes temperature sensors and a flow controller, according to one embodiment of the invention.

FIG. 4 is an illustration of a datacenter system that includes temperature sensors and a flow controller, according to one embodiment of the invention. As shown, the datacenter includes a first holding container 104A and a second holding container 1048, wherein each holding container is connected to a flow controller 402. The flow controller 402 is configured to receive temperature sensor data from a plurality of temperature sensor devices 404A-404D located throughout the datacenter, wherein the temperature sensor data may be communicated wirelessly or alternatively over wires. If the temperature sensor data indicates that the temperature in an identified area of the datacenter is above a predefined threshold, the flow controller 402 is configured to direct the flow of the first substance 110 and the second substance 112 to the identified area as described in further detail in FIG. 5 and associated descriptions.

For example, if the continued operation of server 302 and server 304 increase the temperature of a first datacenter area 406 and a second datacenter area 408, the plurality of temperature sensor devices 404A-404D communicate that increase in temperature to the flow controller 402. Thus, if temperature sensor device 404C and temperature sensor device 404D send temperature sensor data that signals to the flow controller 402 an increase in temperature in the second datacenter area 408 above a predefined temperature threshold, the flow controller is configured to direct the flow of the first substance 110 and the second substance 112 to holding container 104B.

Alternatively, if, for example, temperature sensor device 404A and temperature sensor device 404B send temperature sensor data that indicates to the flow controller 402 an increase in temperature in the first datacenter area 406 that is insufficient to meet the predefined temperature threshold, the flow controller maintains its current state.

Figure 5:
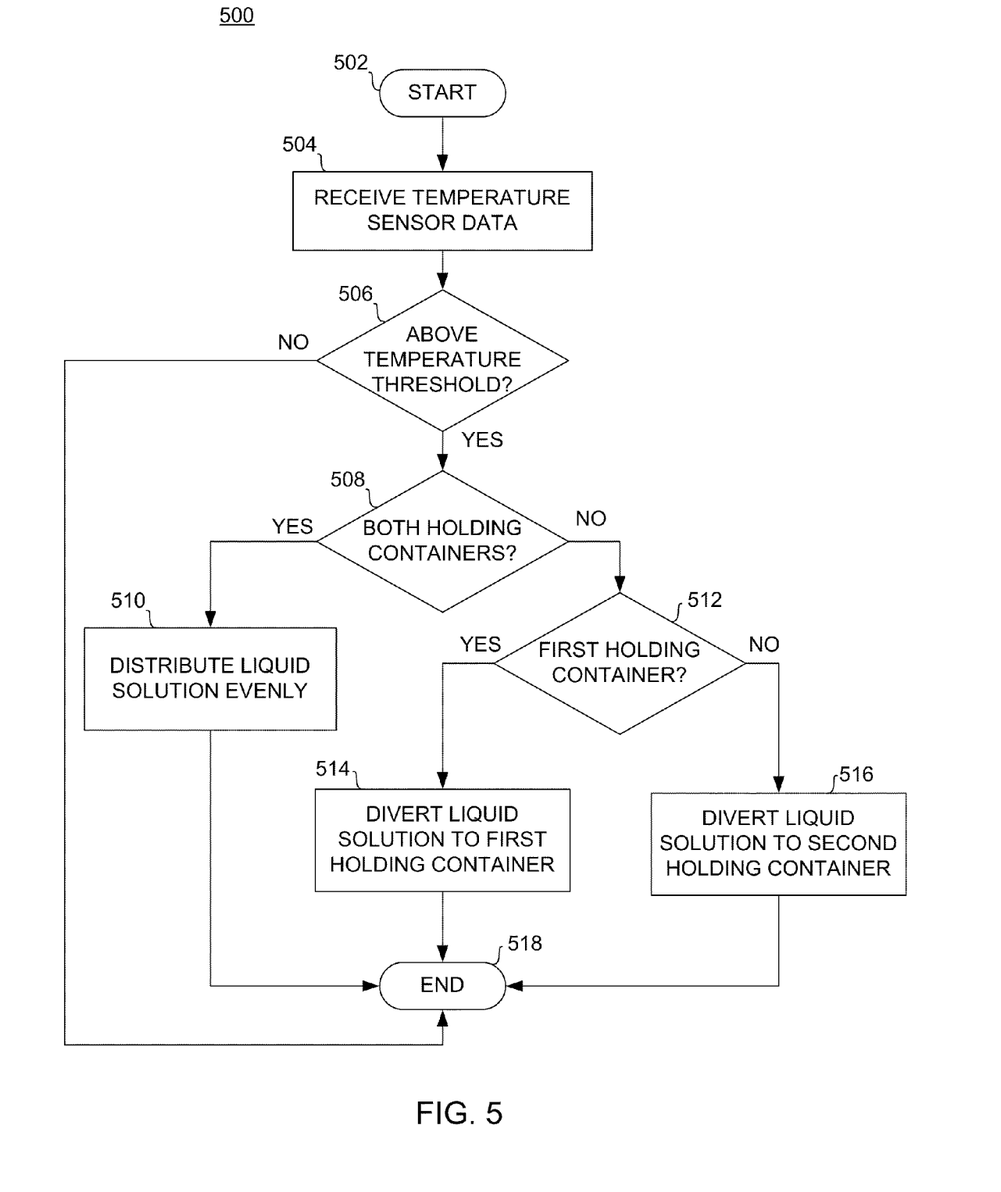
FIG. 5 is a flow chart illustrating, in general, the operation of the flow controller, according to one embodiment of the invention.

FIG. 5 is a flow chart illustrating, in general, the operation of the flow controller 402 in FIG. 4, according to one embodiment of the invention. As shown, the process starts at block 502. At block 504, the flow controller receives temperature sensor data. At block 506, the flow controller determines if the temperature is above the predefined temperature threshold based on the temperature sensor data. If YES, control passes to block 508. If NO, control passes to block 518 the end of process 500.

At block 508, the flow controller determines if the temperature is above the predefined temperature threshold in areas surrounding both holding containers. If YES, the flow controller distributes the cooling solution evenly to both holding containers at block 510 and control passes to block 518, the end of process 500. If NO, control passes to block 512.

At block 512, the flow controller determines if the temperatures is above the predefined temperature threshold in an area surrounding the first holding container. IF YES, the flow controller diverts the cooling solution to the first holding container at block 514 and control passes to block 518, the end of process 500. IF NO, the flow controller diverts the cooling solution to the second holding container at block 516 and control passes to block 518, the end of process 500. Those skilled in the art will appreciate that the process could similarly be configured to operate with three or more holding containers.

Figure 6A:
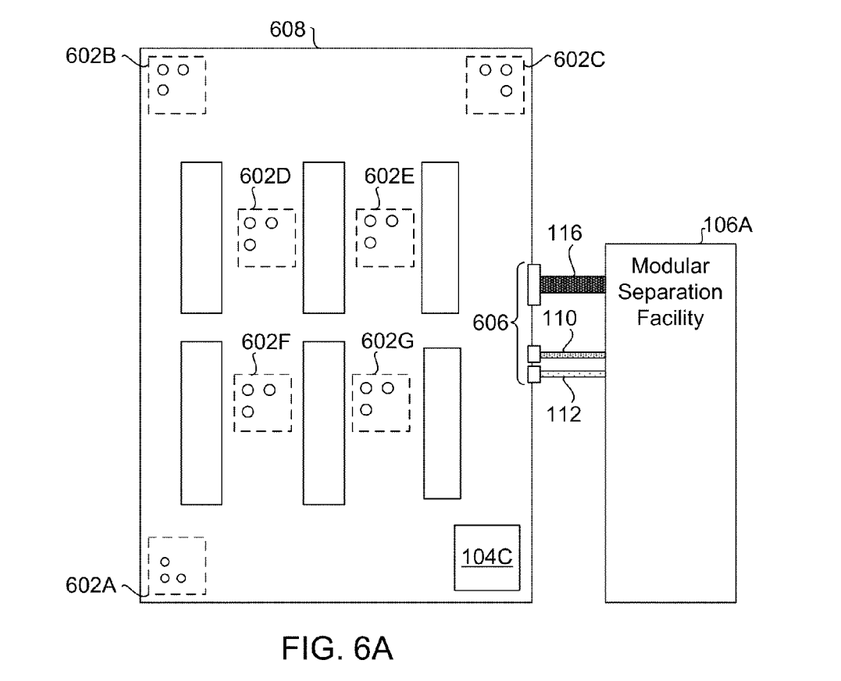
FIGS. 6A-6B illustrates a modular datacenter system, according to one embodiment of the invention.
Figure 6B:
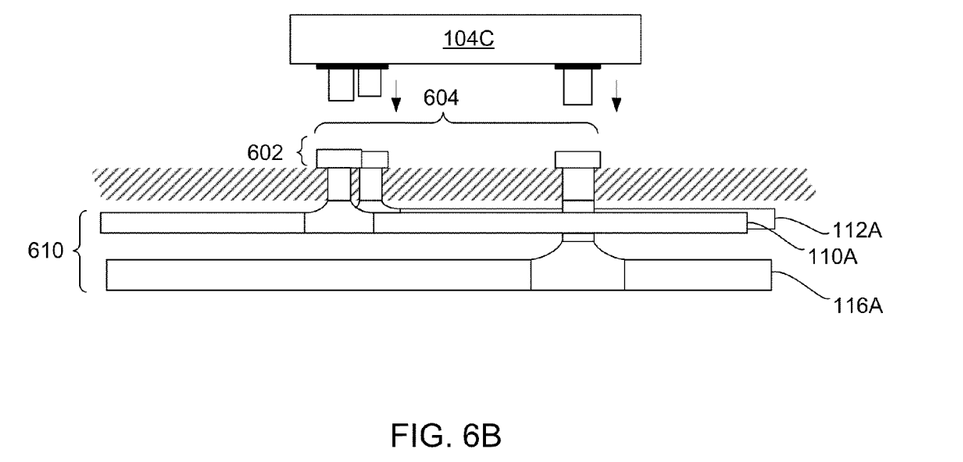

FIGS. 6A-6B illustrates a modular datacenter system, according to one embodiment of the invention. A benefit of such an embodiment is that such systems can be designed to be small enough to provide targeted cooling to problem areas within the datacenter and can also be designed to fit in smaller datacenters or rooms.

FIG. 6A is a datacenter system 608 adapted to include a plurality of holding container receiving points 602A-602G, wherein each holding container receiving point is configured to connect to a modular holding container 104C as detailed further in FIG. 6B. Similar to FIG. 1, the datacenter system 608 is configured to release the first substance 110 and the second substance 112 into the modular holding container 104C where it is mixed to create the cooling solution 116. In an alternative embodiment, a pump, separate from the datacenter system 608, is configured to maintain cooling solution 116 circulation and pressure throughout the datacenter system 608.

In addition, the datacenter system 608 may include a separation facility receiving point 606 for connecting to a modular separation facility 106A, wherein the separation receiving point 606 is coupled to a cooling solution transport piping system included in the datacenter system 608 and wherein the cooling solution transport piping system is coupled to the plurality of holding container receiving points 602A-602G as further described in FIG. 6B.

Similar to FIG. 1, the modular separation facility 608 in FIG. 6A separates the cooling solution 116 into the first substance 110 and the second substance 112. In addition, the modular separation facility 106A may be adapted to connect and disconnect, via a detachable set of hoses for example, to the datacenter system 608 as necessary to minimize demand on the cooling infrastructure. The modular separation facility 106A may include a storage tank for storing each of the first substance 110 and the second substance 112, a pump, and a separation unit as described in FIG. 1. The housing structure of the modular separation facility 106A, containing the storage tanks, the pump, and the separate unit, may be in the form of a shipping container, semi-trailer, or full-trailer for example for convenient transport by truck, train, or cargo ship.

In one embodiment, the datacenter system 608 may include temperature sensors that provide temperature data indicating areas of the datacenter that continue to operate at higher temperatures compared with other areas, thus enabling an operator to strategically position one or more modular holding containers 104C in the datacenter.

In an alternative embodiment, a computer may be coupled to the datacenter system 608, wherein the computer is configured to provide a graphical display including a datacenter heat map and wherein the datacenter heat map indicates through the use of color the range of temperatures within the datacenter. The computer may be further configured to recommend one or more holding container receiving points for connecting one or more modular holding containers 104C based on high temperature areas on the datacenter heat map. Those skilled in the art will appreciate that the datacenter system may be a facility at a fixed location or alternatively may be a mobile datacenter stored in a cargo container for example.

FIG. 6B is a close-up cross section view of FIG. 6A showing the modular holding container 104C, a holding container receiving point 602, and a segment of the solution transport piping system 610. As shown, the holding container receiving point 602 includes three sockets 604, wherein the three sockets 604 are designed to receive three connectors extending from the body of the modular holding container 104C. Each of the three sockets 604 is coupled to a pipe in the solution transport piping system 610 and is designed to transport the cooling solution and the two substances to the modular holding container 104C via the solution transport piping system 610.

The solution transport piping system 610 includes a dedicated first substance transport 110A, a dedicated second substance transport 112A, and a dedicated cooling solution transport 116A, facilitating substance and solution transport between the datacenter and the modular separation facility.

In one embodiment, the three sockets 604 in the holding container receiving point 602 include a redundant seal that prevents solution from exiting the solution transport piping system 610 when the modular holding container 104C is disengaged. Those skilled in the art will appreciate alternative embodiments for preventing leakage.

Although the above described embodiments may be configured to operate independently from CRAC units servicing the datacenter that includes the datacenter system, the datacenter system may, in an alternative embodiment, be coupled to the CRAC units and may be configured to receive periodic status data relating to the operation of the CRAC unit. In particular, the status data may include, for example, CRAC unit usage data or CRAC unit failure data, or both. In particular, the datacenter system may receive temperature and pressure based fault detection of the vapor compression cycle of the rooftop cooling equipment. Alternatively, the datacenter system may be configured to receive power signature analysis (PSA) data relating to CRAC unit performance and possible CRAC unit degradation. Specifically, the datacenter system may use power signature analysis (PSA) data, as is known in the art, to detect, among other things, condenser or evaporator fouling, bypass leakage, fan rotor faults, and/or internal compressor damage, for example. Such an embodiment is described in further detail in FIGS. 7A-7B and associated descriptions.

Figure 7A:
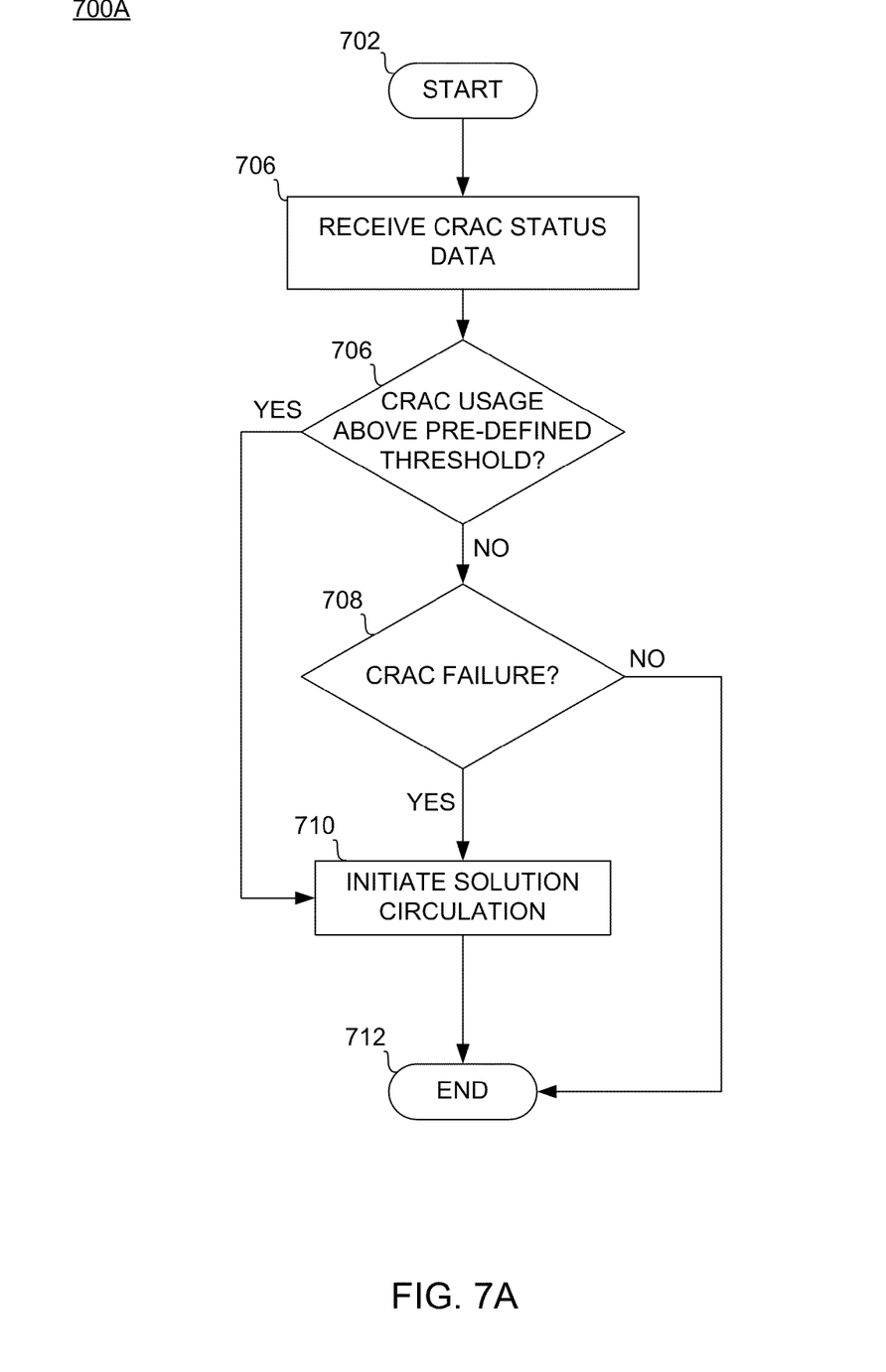
FIGS. 7A-7B illustrates the operation of a datacenter system coupled to a CRAC unit.
Figure 7B:
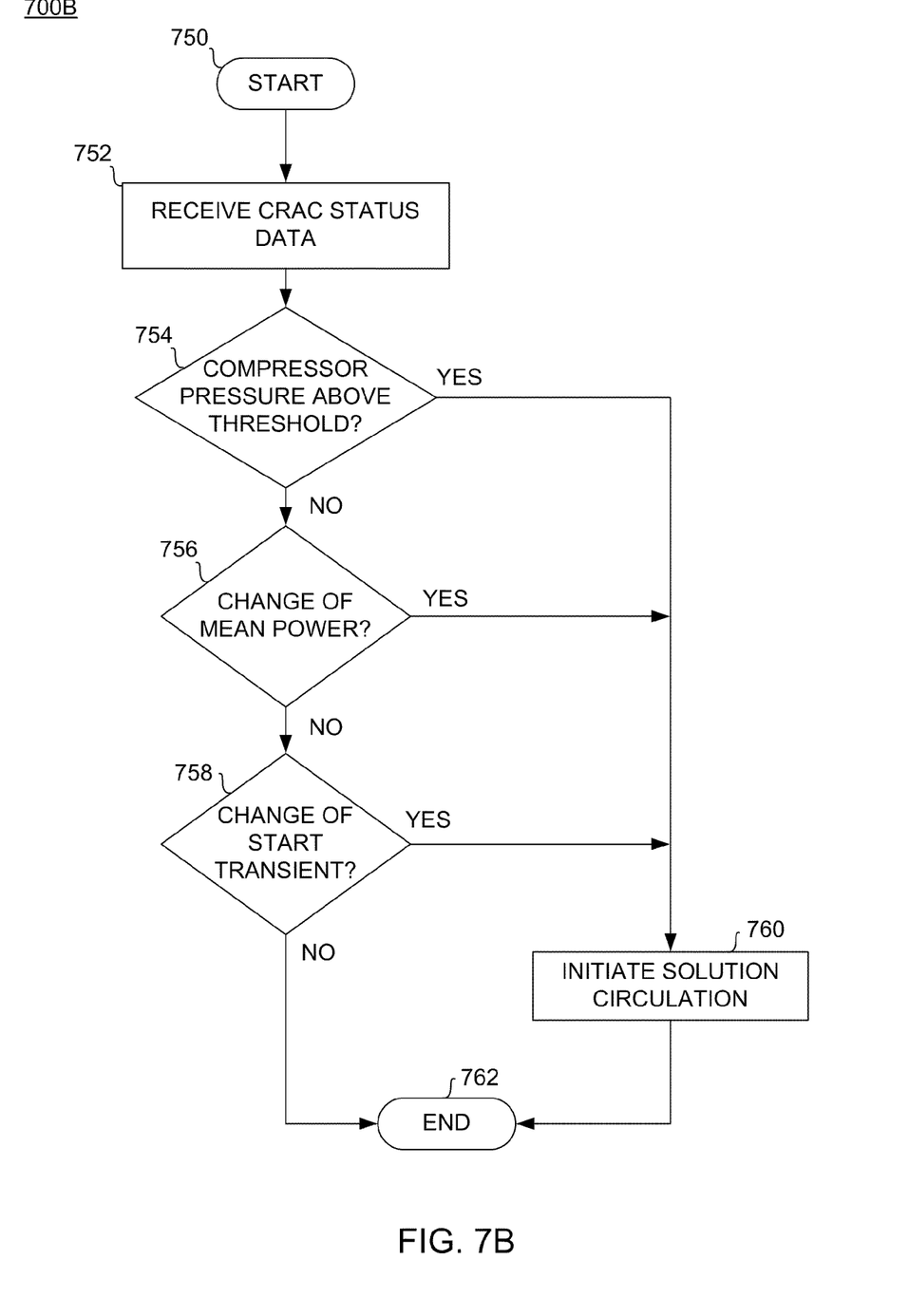

FIGS. 7A and 7B illustrate the operation of a datacenter system coupled to a CRAC unit. In particular, FIG. 7A illustrates a datacenter system configured to detect CRAC unit failure and usage based on received data. As shown, the process starts at block 702. At block 704, the datacenter system receives CRAC status data. At block 706, the datacenter system determines, based on the received CRAC status data, if CRAC usage is above a predefined threshold, wherein usage is defined as a percentage of the number of hours the CRAC unit operates within a defined period of time. If YES, the datacenter system initiates solution circulation at block 710. Thus, if the received CRAC usage data indicated that a CRAC unit was running at peak (100%) usage above a predefined threshold of 90%, for example, the datacenter system would initiate solution circulation. If NO, control passes to block 708.

At block 708, the datacenter system determines, based on the CRAC status data, if there has been a CRAC failure. If NO, control passes to block 712 the end of process 700A. If YES, the datacenter system initiates solution circulation at block 710 and control passes to block 712, the end of process 700A.

FIG. 7B illustrates a datacenter system configured to detect CRAC unit degradation and faults based on received data. As shown the process starts at block 750. At block 752, the datacenter system receives CRAC status data. At block 754, the datacenter system determines, based on received CRAC status data, if compressor pressure is above a predefined threshold, wherein the compressor pressure is an indication of a properly functioning CRAC unit. If YES, the datacenter system initiates solution circulation at block 760 and control passes to block 762, the end of process 700B. If NO, control passes to block 756.

At block 756, the datacenter system determines, based on a power signature analysis in the CRAC status data, if there has been a change in the mean power associated with the CRAC unit, wherein variation in mean power is an indication of an air-side restriction. If YES, the datacenter system initiates solution circulation at block 760 and control passes to block 762, the end of process 700B. If NO, control passes to block 758.

At block 758, the datacenter system determines, based on a power signature analysis in the CRAC status data, if there has been a change in the start transient, wherein variation in the start transient is an indication of compressor leakage, flood, or liquid ingestion. If YES, the datacenter system initiates solution circulation at block 760 and control passes to block 762, the end of process 700B. If NO, control passes to block 762, the end of process 700B.

Embodiments of the present invention also provide power saving benefits over compressor driven CRAC units by eliminating the compressor and the associated power demands that come with the compressor. In contrast, embodiments of the present invention do not require a compressor, thus reducing the power per cooling unit as compared with the typical compressor driven CRAC unit. In addition, as described above, the datacenter system may be run intermittently based on temperature and/or CRAC usage feedback, in contrast to air handlers units in CRAC systems that run twenty-four hours per day, thus providing additional power savings.

In the above, reference is made to embodiments of the invention. However, it should be understood that the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A datacenter system comprising:
a secondary cooling system for providing standby emergency cooling for a datacenter cooled by a primary CRAC system, said secondary cooling system being inactive during normal operation of said primary CRAC system and being automatically activated responsive to detecting at least one condition indicating operational failure of said primary CRAC system, wherein said primary CRAC system operates to cool said datacenter by vapor compression of a coolant without undergoing an endothermic reaction and said secondary cooling system operates independently of said primary CRAC system, said secondary cooling system comprising:
a holding container;
wherein the holding container is composed of a thermally conductive material selected from a group consisting of copper and aluminum;
wherein the holding container is configured to circulate a cooling solution, the cooling solution being composed of a combination of at least two substances, a first liquid substance and a second liquid substance, that create an endothermic reaction when mixed; and
a separation unit having a dialyzing membrane coupled to the holding container;

wherein the separation unit is configured to separate the cooling solution into the first liquid substance and the second liquid substance; and wherein the separation unit receives the cooling solution from the holding container, separates the cooling solution into the first liquid substance and the second liquid substance by dialysis through said dialyzing membrane, and circulates the first substance and the second substance to the holding container.

2. The datacenter system of claim 1, wherein the dialyzing membrane is a hydrophilic and semi-permeable polyamide.

* * * * *